(12) United States Patent
England et al.

(10) Patent No.: US 8,003,498 B2
(45) Date of Patent: Aug. 23, 2011

(54) PARTICLE BEAM ASSISTED MODIFICATION OF THIN FILM MATERIALS

(75) Inventors: Jonathan G. England, Horsham (GB); Frank Sinclair, Quincy, MA (US); John (Bon-Woong) Koo, Andover, MA (US); Rajesh Dorai, Woburn, MA (US); Ludovic Godet, North Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/269,344

(22) Filed: Nov. 12, 2008

(65) Prior Publication Data
US 2009/0124066 A1 May 14, 2009

Related U.S. Application Data

(60) Provisional application No. 60/987,629, filed on Nov. 13, 2007, provisional application No. 60/987,667, filed on Nov. 13, 2007, provisional application No. 60/987,650, filed on Nov. 13, 2007.

(51) Int. Cl.
*H01L 21/20* (2006.01)
*H01L 21/36* (2006.01)

(52) U.S. Cl. ................. 438/486; 257/E21.331

(58) Field of Classification Search .......... 438/486; 257/E21.133, E21.135
See application file for complete search history.

(56) References Cited

U.S. PATENT DOCUMENTS

| | | | |
|---|---|---|---|
| 5,923,997 A | 7/1999 | Mitanaga et al. | |
| 6,667,478 B2 | 12/2003 | Frosien et al. | |
| 6,867,074 B2 | 3/2005 | Tsao | |

FOREIGN PATENT DOCUMENTS

| | | |
|---|---|---|
| JP | S57-058315 | 8/1982 |
| JP | 10-064842 A | 3/1998 |
| JP | H10-256153 | 9/1998 |
| JP | 2006-245326 A | 9/2006 |
| KR | 10-1999-0050318 A | 7/1999 |

OTHER PUBLICATIONS

Wolf et al., Silicon Processing for the VLSI ERA, vol. 1, 1986, pp. 301-302.*
Brimhall, J.L., Effect of irradiation particle mass on crystallization of amorphous alloys; Journal of Materials Science, 1984 pp. 181-1826.*
Spinella, Corrado, et al., "Crystal Grain Nucleation in Amorphous Silicon", Journal of Applied Physics, vol. 84, No. 10, Applied Physics Reviews, Nov. 15, 1998, pp. 5383-5414.

* cited by examiner

*Primary Examiner* — Jarrett J Stark

(57) ABSTRACT

Several examples of a method for processing a substrate are disclosed. In a particular embodiment, the method may include: introducing a plurality of first particles to a first region of the substrate so as to form at least one crystal having a grain boundary in the first region without forming another crystal in a second region, the second region adjacent to the first region; and extending the grain boundary of the at least one crystal formed in the first region to the second region after stopping the introducing the plurality of first particles.

34 Claims, 10 Drawing Sheets

PARTICLE BEAM ASSISTED MODIFICATION OF THIN FILM MATERIALS

PRIORITY

This application claims priority to a Provisional Applications No. 60/987,629 titled "Particle Beam Assisted Modification of Thin Film Materials" and filed on Nov. 13, 2007; a Provisional Application No. 60/987,667 titled "Particle Beam Assisted Modification of Thin Film Materials" and filed on Nov. 13, 2007; and a Provisional Application 60/987,650 titled "Particle Beam Assisted Modification of Thin Film Materials" and filed on Nov. 13, 2007, each of which is incorporated in entirety by reference.

RELATED APPLICATIONS

This application is related to co-pending application Ser. No. 12/269,327 titled "Particle Beam Assisted Modification of Thin Film Materials" and filed on Nov. 12, 2008, and co-pending application Ser. No. 12/269,276 titled "Particle Beam Assisted Modification of Thin Film Materials" and filed on Nov. 12, 2008. Each co-pending application is incorporated herein in entirety by reference.

FIELD

This disclosure relates to a system and technique for processing a substrate, more particularly, to a system and technique for forming a substrate crystalline phase.

BACKGROUND

The widespread adoption of emerging technologies such as flat panel displays (FPD) and solar cells depends on the ability to manufacture electrical devices on low cost substrates. In manufacturing FPD, pixels of a typical low cost flat panel display (FPD), are switched by thin film transistors (TFT) which may be typically manufactured on thin (~50 nm thick) films of amorphous silicon deposited on inert, glass substrates. However, improved FPDs demand better performing pixel TFTs, and it may be advantageous to manufacture high performance control electronics directly onto the panel. One advantage may be to eliminate the need for costly and potentially unreliable connections between the panel and external control circuitry.

Current FPDs contain a layer of Si that is deposited onto the glass panel of the display via a low temperature deposition process such as sputtering, evaporation, plasma enhanced chemical vapor deposition (PECVD), or low pressure chemical vapor deposition (LPCVD) process. Such low temperature processes are desirable, as the panel used to manufacture FPD tends to be amorphous and has glass transition temperature of approximately 600° C. If manufactured above 600° C., the panel may have a non-uniform or uneven structure or surface. Higher temperature tolerant glass panels such as quartz or sapphire panel exist; however, the high cost of such glasses discourages their use. Further cost reduction would be possible if cheaper, lower temperature tolerant glass or plastic panels could be used.

The low temperature deposition process, however, does not yield optimal Si film. As known in the art, solid Si has three common phases: amorphous, poly-crystalline, and mono-crystalline phases. If Si is deposited at low temperature, the deposited Si film tends to be in an amorphous phase. The channels of thin film transistors based on amorphous Si film may have lower mobility compared to those on either poly-crystalline Si or mono-crystalline Si films.

To obtain a polycrystalline or mono-crystalline Si layer, the panel may undergo further processes to convert the amorphous Si film to either polycrystalline or mono-crystalline film. To obtain a panel with poly-crystalline Si film, the panel may undergo an excimer laser annealing (ELA) process. An example of the ELA process may be found in more detail in U.S. Pat. No. 5,766,989. To obtain a panel with larger crystals, the panel may undergo a process known as Sequential Lateral Solidification ("SLS") process. An example of SLS process may be found in U.S. Pat. No. 6,322,625. Although ELA and SLS processes may result in a panel with mono-crystalline or poly-crystalline Si thin film, each process is not without disadvantages. For example, excimer lasers used in both processes may be expensive to operate, resulting in an expensive TFT. In addition, the duty cycle may not be optimum for the best conversion of amorphous Si into crystalline Si. Further, the excimer laser may have pulse-to-pulse variations and spatial non-uniformity in the delivered power which may affect the uniformity of the processes. There may also be intra-pulse non-uniformity which may be caused by for example, self-interference of the beam. Such inter-pulse and intra-pulse non-uniformity may result in Si films with non-uniform crystals.

As such, new methods and apparatus for particle processing for the cost effective and production worthy manufacture of high quality crystalline materials on low temperature substrates are needed.

SUMMARY

Several examples of a method for processing a substrate are disclosed. In a particular embodiment, the method may include: introducing a plurality of first particles to a first region of the substrate so as to form at least one crystal having a grain boundary in the first region without forming another crystal in a second region, the second region adjacent to the first region; and extending the grain boundary of the at least one crystal formed in the first region to the second region after stopping the introducing the plurality of first particles.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like features are referenced with like numerals. These figures should not be construed as limiting the present disclosure, but are intended to be exemplary only.

DETAILED DESCRIPTION

To overcome the above-identified and other deficiencies of existing laser-based thin film materials processing, several embodiments of particle based processing are disclosed. The particle-based processing may be advantageous as it may promote non-equilibrium processes. In addition, particle parameters may be controlled with much more precision than parameters of the laser. Examples of the particle parameters may include spatial parameters (such as beam size and current densities), particle flux (and/or beam current), particles species, and particle dose etc. . . .

In the present disclosure, several embodiments are disclosed in context to a beamline ion implantation system and a plasma based substrate processing system such as, for example, a plasma assisted doping (PLAD) system or plasma immersion ion implantation (PIII) system. However, those of ordinary skill in the art should recognize that the present disclosure may be equally applicable to other systems including other types of particle based system. The term "particles" used herein may refer to sub-atomic, atomic, or molecular particles, charged or neutral. For example, the particles may be protons; ions, atomic or molecular; or gas clusters.

In the present disclosure, several embodiments are described in context to a substrate. The substrate may be a wafer (e.g. Si wafer) or a substrate comprising a plurality of films. In addition, the substrate may be an elemental substrate containing only one element (e.g. Si wafer or metal foil); a compound substrate containing more than one element (e.g. SiGe, SiC, InTe, GaAs, InP, GaInAs, GaInP; CdTe; CdS; and combinations of (Cu, Ag and/or Au) with (Al, Ga, and/or In) and (S, Se and/or Te) such as CuInGaSe, CuInSe2, other group III-V semiconductors and other group II-VI compounds); and/or an alloy substrate. The material contained in the substrate may be metal, semiconductor, and/or insulator (e.g. glass, Polyethylene terephthalate (PET), sapphire, and quartz). Further, the substrate may be a thin film substrate containing multiple layers (e.g. SOI). If the substrate comprises multiple layers, at least one of the layers may be a semiconducting film or a metallic film, whereas another one of the films may be an insulator. The semiconducting or metallic film may be disposed on a single insulating film or, alternatively, interposed between a plurality of insulating films. Conversely, the insulating film may be disposed on a single semiconducting or metallic film or, alternatively, interposed between multiple semiconducting or metallic films or both.

Phase Transformation

Figure 1:
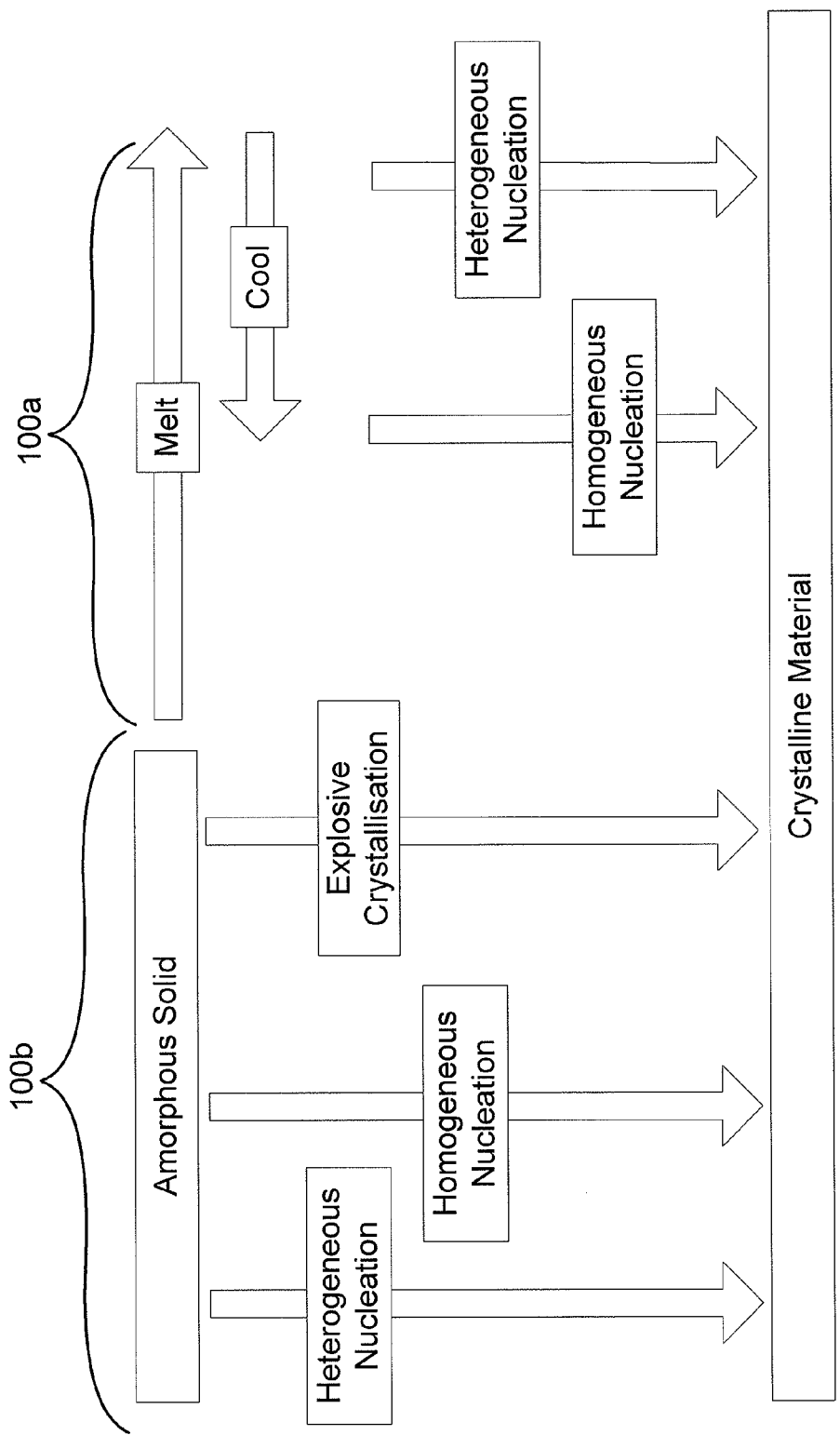
FIG. 1 is a block diagram of various mechanisms through which amorphous material may transform into crystalline material.

The most rapid mechanism for crystallization of thin amorphous layers is solid phase epitaxial re-growth (SPER). In SPER, amorphous Si may transform to crystalline Si by extending an underlying, pre-existing, extensive crystal layer. This scenario is commonly encountered during annealing of a surface layer of a crystalline Si wafer after it has been amorphized by ion implantation. The present disclosure relate to processing an amorphous substrate in which an extensive pre-existing lattice does not exist and which phase transformation occur via crystal nucleation prior to the growth of the crystals. Referring to FIG. 1, there is shown a block diagram of various mechanisms through which a material without extensive pre-existing lattice may transform from an amorphous phase into a crystalline phase. As known in the art, the crystalline phase may be categorized as a poly-crystalline phase or a mono-crystalline phase. The poly-crystalline phase may sometimes be further subdivided into different categories (such as multi-, micro-, nano-crystalline etc) depending on the crystal size. However, such a distinction may not be important in the context of this disclosure, and may not be necessary to describe FIG. 1. Accordingly, these phases may be referred herein collectively as a crystalline phase.

As illustrated in FIG. 1, the phase transformation from the amorphous phase to a crystalline phase may occur via various mechanisms. For example, the transformation may occur via melting and solidification mechanism 10a and solid phase crystallization (SPC) transformation mechanism 100b. In the melting and solidification mechanism 100a and SPC mechanism, the transformation may occur via nucleation of crystallites and growth of the crystallites. In the SPER mechanism, the transformation may occur by growth on the extensive pre-existing crystal lattice.

In the melting and solidification mechanism 100a, energy in the form of radiation, heat, or kinetic energy, may be introduced to a portion of the amorphous substrate and melt the portion. If the condition of the molten region is adequate to induce nucleation (e.g. supercooling), crystals may nucleate as described by the classical nucleation theory. The crystals may nucleate via two schemes. The crystals may nucleate heterogeneously on pre-existing seeds. The pre-existing seeds may be grain boundaries of pre-existing crystals that did not melt upon introduction of the energy. The pre-exiting seeds may also be the boundary between the molten region and adjacent solid region. If the pre-existing seeds are absent, the crystals may nucleate homogeneously. Upon nucleation, the crystals may grow until the growth is halted.

In the solid phase transformation mechanism 10b, the phase transformation may occur despite the absence of the melting. For example, crystals may nucleate in the region introduced with energy, and the nucleation may be followed by the growth of the nucleated crystals. As in the case of the melt process, nucleation during SPC can occur heterogeneously if pre-existing seeds exist, or homogeneously if such seeds are absent.

Particle Assisted Processes

In the present disclosure, particles may be introduced to a substrate to induce the phase transformation. The phase transformation may be that from the amorphous phase to one of the polycrystalline and/or mono-crystalline phases. In addition, the phase transformation may occur via nucleation and growth of the crystals. To induce the transformation, the particles may be introduced near the upper surface of the substrate, the lower surface of the substrate, or a region between the upper and lower surfaces, or a combination thereof. If the substrate comprises two or more different materials, the particles may be introduced to a region near the interface of the different materials.

Particle Species

Numerous types of particles may be introduced to induce the phase transformation. For example, the particles that are chemically and/or electrically inert with respect to the substrate may be used. However, chemically and/or electrically active material may also be used. As noted above, the particles may be charged or neutral sub-atomic particles, atomic particles, or molecular particles, or a combination thereof. In some embodiments, molecular particles are preferred. In other embodiments, cluster particles are preferred. Molecular and cluster particles may be preferred as they may be introduced to the substrate at much higher dose and energy. In particular, molecular and cluster particles introduced to a substrate may disintegrate on impact, and the kinetic energy of the particles may be shared in the ratio of the atomic masses of the particle atoms. The overlapping collision cascades may achieve result similar to introduction of atomic particles at much higher dose rate. Due to their greater mass, the molecular particles may also be introduced to the substrate at much higher energy. The generation of atomic and molecular species in implanters, PLAD and PIII will be familiar to those skilled in the art. A detailed description of the generation of cluster particles may be found in U.S. Pat. No. 5,459,326, which is incorporated in entirety by reference.

The choice of the particles introduced to the substrate may also depend on the effect of the particles on the substrate. Some characteristics and illustrative examples are shown in Table 1.

TABLE 1

Some possible choices of ion species

| Characteristic | Example species |
|---|---|
| Electrically inactive in silicon | Ge, Si, C, F, N H, He, Sn, Pb, hydrocarbon molecules, molecules containing C and two or more other elements, hydrides of silicon such as tetra-silane, molecules containing Si and two or more other elements |
| Dopants | B, P, As, Sb, In, Ga, Sb, Bi, |
| Shallow Junction Co-implant species | C, F |
| Amorphizing | Noble Gases (including He, Xe), Ge, Si |
| Strain producing | Ge, C |
| Bandgap engineering | Yb, Ti, Hf, Zr, Pd, Pt, Al |
| Passivating | H, D |
| Defect Pinning | N |
| Crystallization catalysts | Ni, metals |

Depth and Energy

When the particles are introduced to the substrate, the kinetic energy of the particles may be transferred to the substrate. The magnitude of the transferred kinetic energy may depend on the size, mass, and energy of the particles. For example, heavy ions introduced to a substrate may experience more nuclear stopping than lighter ions. When the particles lose their kinetic energy via the nuclear stopping mechanism, the mechanism tends to form defects such as, for example, dangling bonds, vacancies, and di-vacancies, whose presence may enhance the crystallization process. At the same time, kinetic energy transferred to the substrate via electronic stopping may cause crystallization.

Depending on the energy of the particles, the location of the particles delivery, and the properties of the substrate (e.g. thermal conductivity, heat capacity and melting temperature of the substrate), nucleation of crystals may be initiated at the upper surface of the substrate; the lower surface of the substrate; the region between the upper and lower surfaces; or near the interface of different materials. Thereafter, the phase transformation may continue in a direction away from the location where the transformation is initiated.

Unlike the radiation based phase transformation, energy deposited to the substrate via the particle introduction may peak at the surface or, alternatively, below the surface. In addition, the particles may be introduced to the substrate at a constant energy. Alternatively, the particles may be introduced at varied energies. For example, the energy of the particles introduced to the substrate may change while the particles are being introduced. The change in the energy may occur continuously or in a sequence. If a beam-line particle system is used, the particle energy may be changed during the particle introduction using acceleration or deceleration voltage associated with beam-line systems described herein. If PLAD, PIII, or other plasma based system is used, the energy may be changed during the introduction by varying the voltage applied to the substrate.

Figure 2:
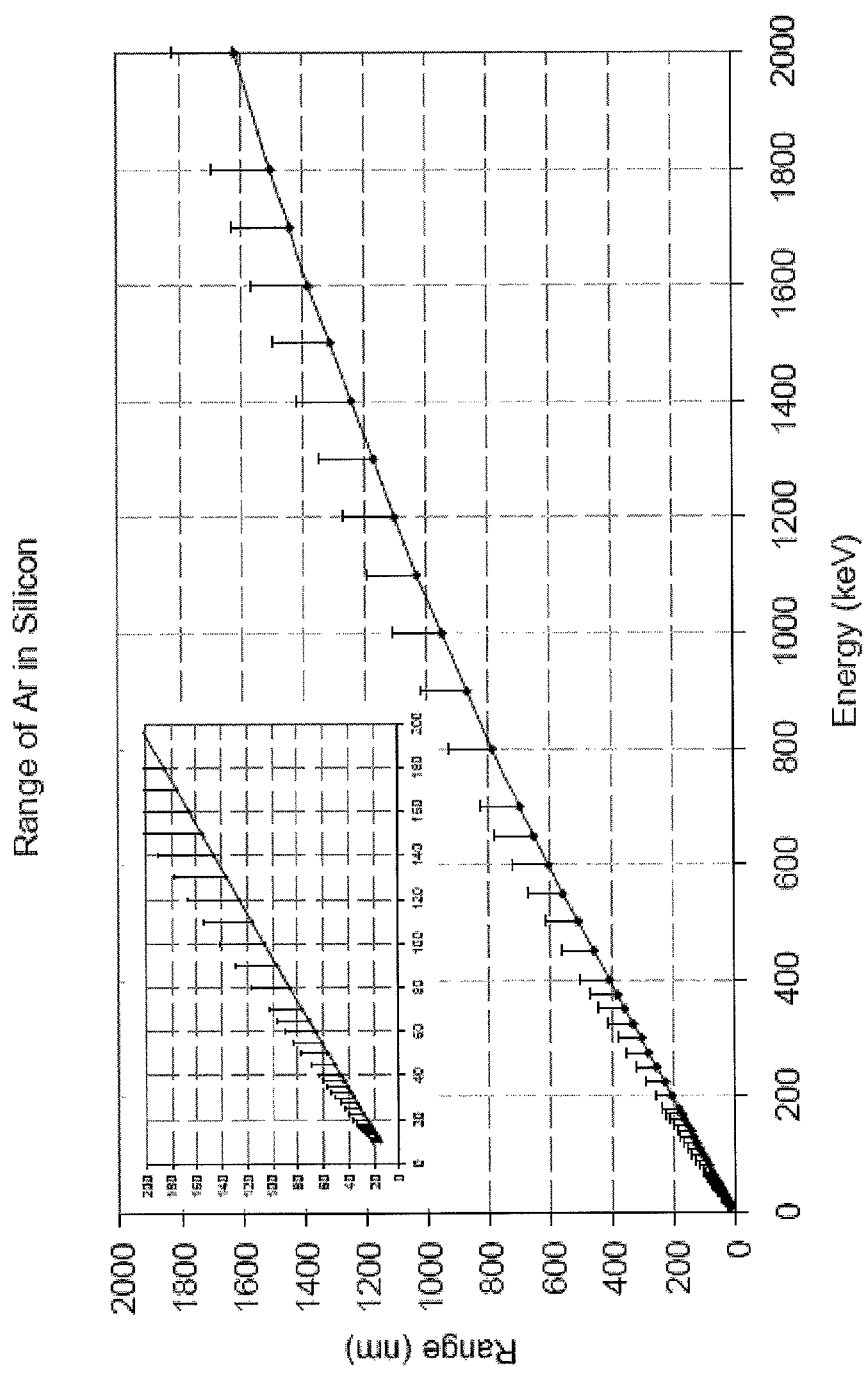
FIG. 2 shows a graph of the depth of Ar ions introduced to a Si substrate according to one embodiment of the present disclosure.

Referring to FIG. 2, there is a graph showing depth and energy of particles introduced to a substrate, according to one embodiment of the present disclosure. In the present embodiment, Ar ions are implanted into Si thin film. As shown in FIG. 2, the points joined by the line represent the average range of the Ar ions and the vertical error bars represent the straggle in depth. The total range of all ions can then be estimated by the sum of the average range plus a multiple (one or more) of the straggle. If the Ar ions were required to be contained within a surface layer of Si of known depth, the maximum energy may be estimated from this curve. The inset chart is a larger representation of the low energy scale of the main chart.

Spatial and Temporal Profile

In addition to the energy, the spatial and temporal profile of the particles may be controlled. For example, the particles may be introduced as a particle beam, and the beam may have constant or varied beam current density (i.e. number of particles in a predetermined area for a predetermined time). The current density may be adjusted by changing the particle current and/or beam size; the beam dwell time by controlling the beam and/or substrate scanning speeds and/or pulse length; and the beam duty cycle (e.g. time between beam pulses or return time if the beam and/or substrate are scanned).

In the present disclosure, the particles may be introduced to the substrate continuously or periodically in sequence. If the particles are introduced as a particle beam, the beam may have various shapes. For example, the particles may be introduced as a ribbon beam or a spot beam. The ribbon beam may have a ribbon shape or a shape where the dimension of the beam along one direction is larger than along another direction. Such a ribbon beam may be wider than the substrate or, alternatively, narrower than the substrate. The spot beam, meanwhile, may have a dimension smaller than the substrate. If used, the spot beam may be scanned, either magnetically or electrostatically at a rate of approximately 100-1000 Hz, to resemble the ribbon beam.

If the cross section of the beam, whether a ribbon beam or a spot beam, is smaller and does not cover the entire surface area of the substrate, the beam may be additionally scanned relative to the substrate. For example, the beam may be scanned along 2 directions, along the width direction and length direction, such that the particles may be introduced to the entire surface of the substrate. In the present disclosure, such scanning may be achieved by translating the substrate along the length and width directions relative to a stationary beam or by translating the beam along the length and width directions relative to the stationary substrate. By controlling the rate of the relative scanning of the beam and/or the substrate, the phase transformation of the substrate may be controlled.

In addition, the particle beam introduced to the substrate may be a focused beam or a non-focused beam. In addition, the particles beam may be uniform or non-uniform along its cross section. For example, a ribbon beam may have a higher current density at its leading edge followed by a trailing edge having a lower current density, or vice versa. The non-uniform beam may have other intensity profiles. It is believed that a non-uniform beam may enhance the nucleation process and the growth process. For example, the non-uniform beam may have an intense leading edge to initiate nucleation, followed by a less intense trailing edge. For example, the high density portion of the beam may initiate the phase transformation by melting the substrate, and the low density portion of the beam may enhance the extent of the transformation by controlling the solidification of the molten region.

Further, more than one beam may be operated and introduced to the substrate either simultaneously or sequentially. If more than one beam is used the beam may be introduced to the entire width and/or length of the substrate at one time.

Direction

The particle assisted phase transformation may have some advantage in orienting the crystal growth and/or crystal shapes. In the present disclosure, the particles may be introduced to the substrate at various angles. Introduction of the particles at various angles may be achieved by the tilting the substrate relative to the beam and/or the beam may be tilted relative to the substrate.

In one embodiment, the particles may be introduced to the substrate at 0° (i.e. perpendicular to the surface of the substrate). The particles introduced at 0° may preferentially destroy {200} grain boundaries that may limit electrical conductivity in FPDs. Alternatively, the particles may be introduced at other angle, for example, 7°.

Substrate Condition

In addition to the parameters of the particles, the conditions of the substrate may be adjusted before, during, or after introduction of the particles. For example, the temperature of the substrate may be adjusted. In one embodiment, the substrate may be heated to, for example, approximately 500° C. prior to or during the introduction of the particles. Heating the substrate may mitigate thermal shock caused by the particle beam. In addition, heating the substrate may induce formation of larger crystals. For example, heating the substrate may cause the region introduced with the particles to cool at a slower rate (as this region may largely loose its energy through conduction into the substrate).

The crystallization may be enhanced if the substrate were cooled below room temperature. For example, the substrate may be cooled to a temperature ranging from about 0° C. to about −100° C. In addition, cooling the substrate may prevent the structure of the insulating film from being unstable.

When the particles are introduced to the substrate, the substrate may be in vacuum or at atmospheric pressure. The vacuum pressure may be higher than those usually associated with ion implantation (i.e. pressure higher than 10-4 mbar) to reduce pump cost.

Exemplary Systems

Figure 3:
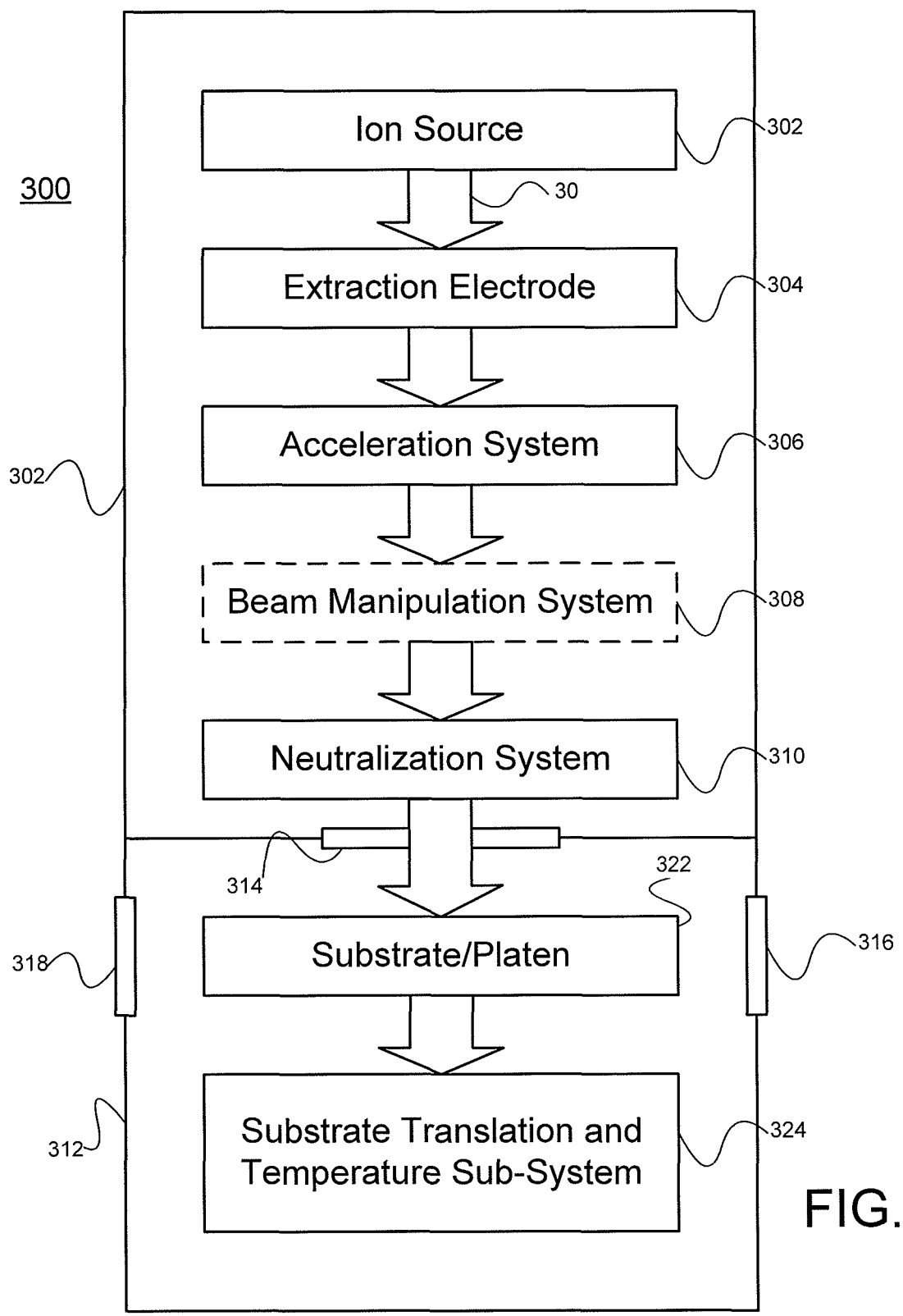
FIG. 3 shows block diagram of a system for processing a substrate according to one embodiment of the present disclosure.

Referring to FIG. 3, there is shown a block diagram of an exemplary system 300 for processing a substrate according to one embodiment of the present disclosure. The system 300 may be a beam-line particle system 300. The system 300 may comprise an ion source 302; an extraction system 304; an acceleration system 306; optional beam manipulation components 308; and a neutralization system 310. In addition, the system 300 may comprise an end station 312 communicating with the neutralization system 310. The end station 312 may comprise a window 314 and one or more loadlocks 316 and 318. Within the end station 312, a platen that supports a substrate 322 may be positioned. In addition, one or more of substrate translation, cooling and/or heating sub-system 324 may be disposed in the end station 312.

In the present disclosure, the ion source 302 may be a Bernas type, with indirectly heated cathode. Those of ordinary skill in the art will recognize that the ion source 302 may also be other types of ion source. Meanwhile, the extraction system 304 may be a single slit or, alternatively, a multiple slit extraction system 304. The extraction system 304 may be translatable in one or more orthogonal directions. In addition, the extraction system 304 may be designed to extract a temporally constant beam current. In addition, the extraction system 304 may extract the particle continuously or intermittently. The extraction system 304 may also focus the particle beam or beamlets to allow a desirable spatial and/or temporal beam profiles. The particles beam extracted via the extraction system 304 may have energy of approximately 80 keV.

Figure 4:
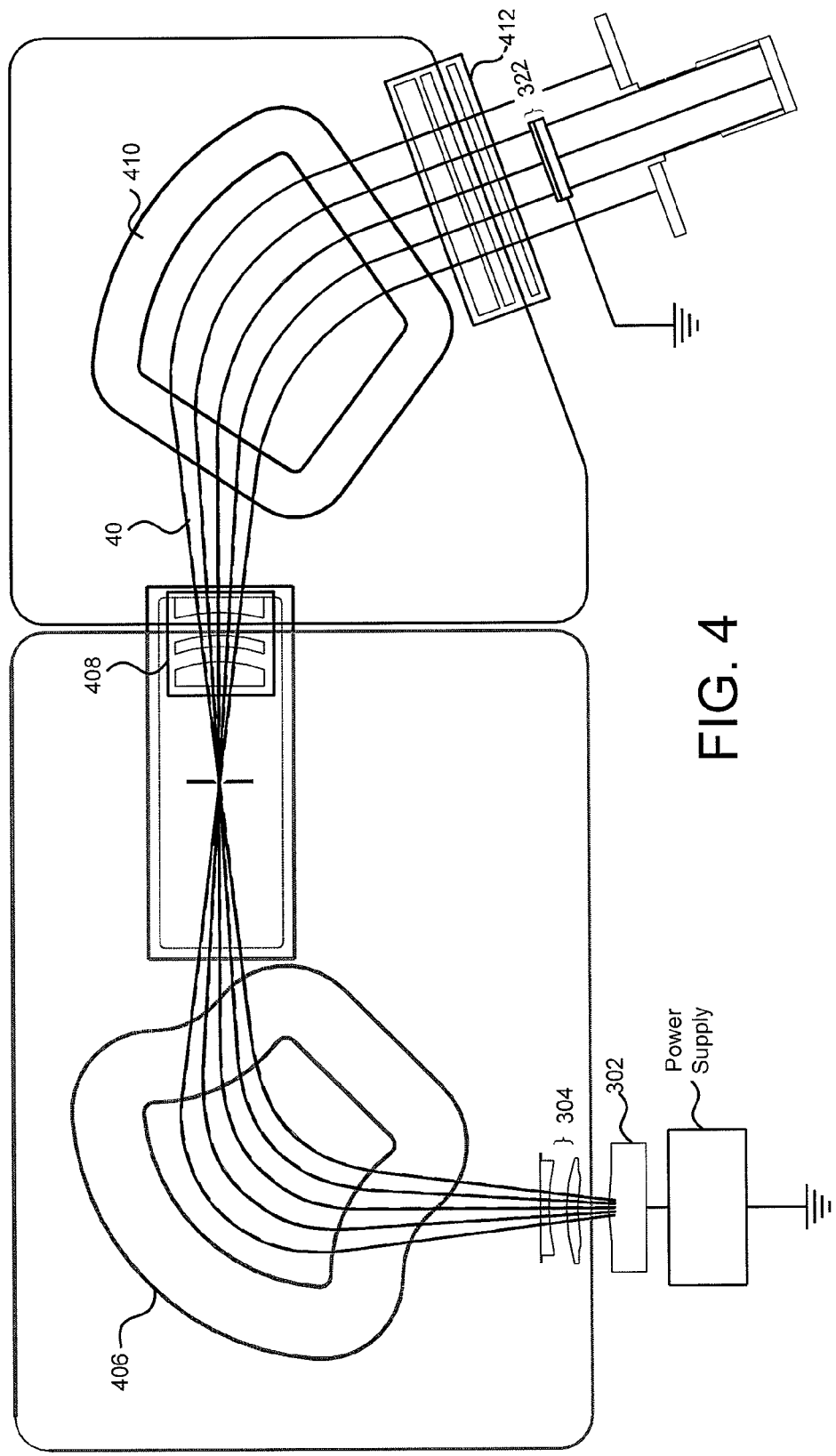
FIG. 4 shows a block diagram of a particular exemplary system of the system shown in FIG. 3.

If higher energy is required, the system 300 may include an acceleration system 306 that may accelerate the particle beam. The system 300 may also include one or more additional, optional beam manipulation components 308 to filter, scan, and shape the particles to a particle beam. As illustrated in FIG. 4, a specific example of the system 300, the optional beam manipulation components 308 may include a first magnet analyzer 406, a first deceleration (D1) stage 408, a second magnet analyzer 410, and a second deceleration and a second deceleration (D2) stage 412. In the present disclosure, the first magnet analyzer 406, a substantially dipole magnet, may filter the particles based on the particles' mass and energy such that particles of undesired mass and/or energy will not pass through the magnet analyzer 406. Meanwhile, the second magnet analyzer 410, another substantially dipole magnet, may be configured to collimate the particles into a particle beam having desired shape (e.g. ribbon) and/or dimension. D1 and D2 deceleration stages 410 and 412 may manipulate the energy of the particles passing through such that the particles may be introduced to the substrate at a desired energy. In one embodiment, the D1 and/or D2 may be segmented lenses capable of minimizing the space charge effect and maintaining spatial integrity of the beam.

Although not shown, the beam manipulation components may also include one or more substantially quadrupole magnets or einzel lenses to focus the beam. Further, the beam manipulation components may also include magnetic multipoles or rods such as described in U.S. Pat. Nos. 6,933,507 and 5,350,926 to control the uniformity of the beam profile.

Returning to FIG. 3, the charge neutralization system 310, according to the present embodiment, may also be included to reduce charge build-up in the substrate 322. The charge neutralization system 310 may be one or more systems of hot filament, or microwave, or rf driven type, such as that described in U.S. patent application Ser. No. 11/376,850. Alternatively, the charge neutralization system 310 may be an electron source.

In the end station, the environment around the substrate may be controlled in order to prevent, for example, deposition of other materials on the substrate or to promote passivation to enhance the crystallization process. To control the environment, the end station 312 may include a thin foil window or a differentially pumped aperture 314, through which the particles may enter, and one or more loadlocks 316 and 318, through which the substrate may be admitted. The loadlocks 316 and 318 may be replaced by one or more differentially pumped stages through which the substrate may be admitted.

The end station 312 may also contain substrate movement, cooling, and heating subsystem 324. Examples of sub-system 324 may include a chiller, a heat source, a roplat capable of translating/rotating the substrate along several axes. Specific examples of the chiller may be found in U.S. patent application Ser. No. 11/504,367, 11/525,878, and 11/733,445, each of which is incorporated by reference in entirety. Specific examples of the heat source may be a laser, flash lamp, platen providing fluid heating, resistive heat source, or those described in U.S. patent application Ser. No. 11/770,220 and 11/778,335, each of which is incorporated by reference in entirety.

To monitor the process and substrate parameters/conditions, one or more parameters/conditions measuring components may also be included near the substrate 322. Such components may be coupled to one or more controllers, and the controllers may control the parameters/conditions of the substrate and/or the particles based upon the signals from the measuring components.

Figure 5:
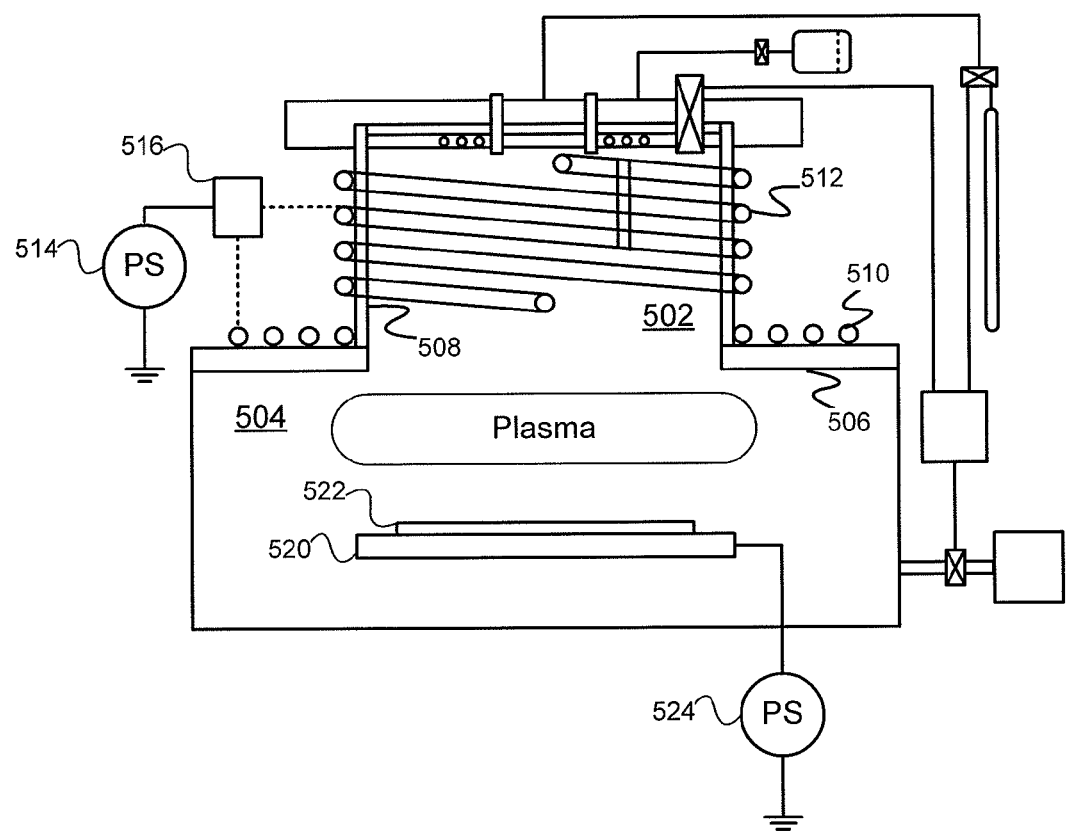
FIG. 5 shows a block diagram of another system for processing a substrate according to another embodiment of the present disclosure.

Referring to FIG. 5, there is shown another exemplary system for processing a substrate according to another embodiment of the present disclosure. In particular, the system 500 may be a PLAD, PIII system, or other plasma based substrate processing system. PLAD system 500 may comprise a chamber 501 including top section 502 and a lower section 504. The top section 502 may include a first dielectric section 506 that extends in a generally horizontal direction and a second dielectric section 508 that extends in a generally vertical direction. In one embodiment, each dielectric section 506 and 508 may be ceramic that is chemically resistant and that has good thermal properties. The top section 502 may also include at least one or more antennas 510 and 512. The one or more antennas 510 and 512 may be, for example, a horizontal antenna 510 and/or a vertical antenna 512. In one embodiment, the horizontal antenna 510 may be a planar coil having multiple windings, whereas the vertical antenna 512 may be a helical coil of multiple windings. At least one of the antennas 510 and 512 may be electrically coupled to a power supply 514 via an impedance matching network 516.

On the lower section 504 of the system 500, a platen 520 and a substrate 522 supported by the platen 520 may be positioned at a predetermined height below the top section 502. However, it is also contemplated that the platen 502 ad the substrate 522 may be positioned in the top section 502. A bias voltage power supply 524 may be electrically coupled to the platen 520 to DC or RF bias the platen 520.

In operation, at least one of the antennas 510 and 512 may be RF or DC powered by the power source 514. If only one of the antennas 510 and 512 is RF or DC powered, the other one of the antennas 510 and 512 may be a parasitic antenna. The other one of the antennas 510 and 512 may be a parasitic antenna as it is not electrically coupled to the power source 514. Instead, the other one of the antennas 510 and 512 is magnetically coupled to the antenna that is powered by the power source 514. Alternatively, both of the antennas 510 and 512 may be powered by the power source 514 with an RF current. Thereafter, at least one of the antennas 510 and 512 induces the RF currents into the system 500 via the first and second dielectric sections 506 and 508. The electromagnetic fields induced by the RF currents may covert the gas contained in the system 500 into plasma. Meanwhile, the bias voltage power supply 524 may bias the platen 520 to attract the charged particles in the plasma to the substrate 522. Additional details of the system 500 may be found in U.S. patent application Ser. No. 11/766,984; application publication No. 2005/0205211; application publication No. 2005/0205212, and application publication No. 2007/0170867, each of which is incorporated in entirety by reference.

Optional Components

In addition to the components described above, the exemplary systems 300-500 may optionally include one or more masks between the particle source (e.g. ion source or plasma) and the substrate. If included, the mask may preferentially be a carbon (C) based material, Si based material (e.g. SiC), or refractory metal, such as W or Ta, containing material. However, other materials may also be used. Such a mask may have one or more aperture having various shapes including chevron shape to control the shape of the beam incident on the substrate.

FPD

Hereinafter, description of several applications of the particle induced phase transformation is provided. As noted above, the particles may be introduced into a Si layer of a thin film substrate to induce the phase transformation from the amorphous to the crystalline phase. For purpose of clarity, a comparison of the particle induced phase transformation is made with the ELA process.

In the present embodiment, the particles may be directed to an FPD having an amorphous Si film of about 500 Å thick disposed on an insulating film. The insulating film may be, for example, amorphous glass or Corning 1737 glass having a thickness of about 0.7 mm, quartz, plastic, or sapphire. However, those of ordinary skill in the art will recognize that other types of insulating film may also be used.

In ELA process, a single laser pulse may deliver an energy pulse of 360 mJ/cm$^2$ in a 12 nanosecond long pulse. This equates to a power density of $3 \times 10^{10}$ W/m$^2$. If an Ar ion beam is directed to the Si film, the beam may have an energy of 20 keV. With such energy, all of the directed Ar ions may not penetrate the substrate beyond the Si layer (see FIG. 2). If a ribbon shaped Ar particle beam is used, the beam may be assumed to have dimensions of 300 mm wide by 0.1 mm tall. With a beam current of 25 mA, this implies a power density of $1.7 \times 10^7$ W/m$^2$.

Figure 6:
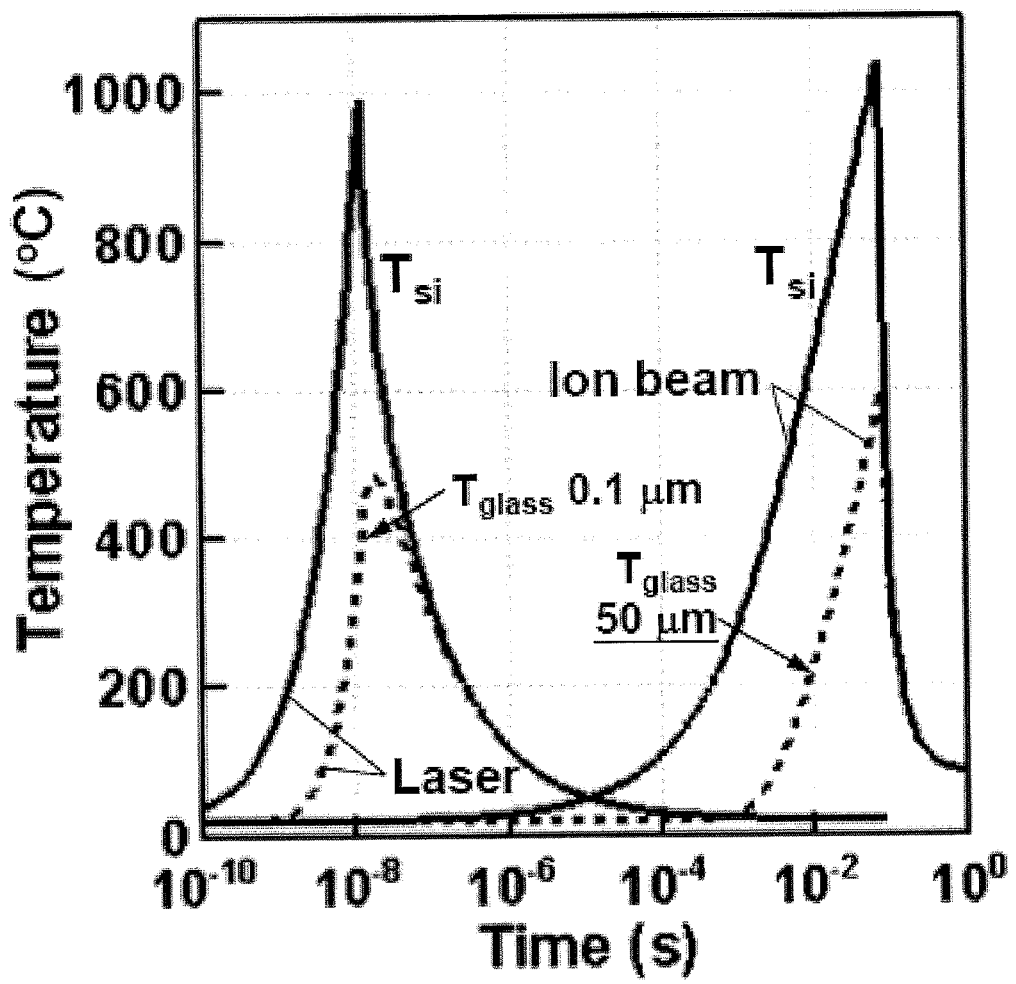
FIG. 6 shows a graph comparing the temperature of a substrate irradiated with a laser beam or a particle beam.

In ELA process, the laser beam incident on the substrate may heat the Si layer to 1000° C., near the melting temperature of amorphous Si. Upon incidence, the laser beam may initiate at least a partial melting of Si layer. The thermal diffusivity for Si is relatively high, varying between ~1 cm$^2$/sec at room temperature and 0.1 cm$^2$/sec at 1400K. Hence, even if the laser energy is absorbed in the top few nm of the Si surface, absent any latent heat effects, there may be a very small temperature gradient within the Si layer. Heat may diffuse from the Si into the glass. The diffusivity for the glass is small (~0.005 cm2/s over a large temperature range), and so a large thermal gradient may exist across the thick glass layer. The results of the model shown in FIG. 6, calculate that the glass even within 0.1 μm of the Si, does not reach above 500° C.

As the particle beam has a lower power density, the exposure time needed to deposit sufficient energy to heat the Si film may be higher (80 ms) compared to the laser (12 ns). In addition, as the heat deposited to the substrate via the particles may be lost to the insulating via thermal conduction, more energy may be needed to heat the Si film sufficiently. Under these assumptions, the insulating film within 50 μm of the Si may be heated above 600° C. Nevertheless, sufficient amount of the insulating may not be heated above its glass transition (or melting) temperature such that these conditions may be acceptable.

Figure 7:
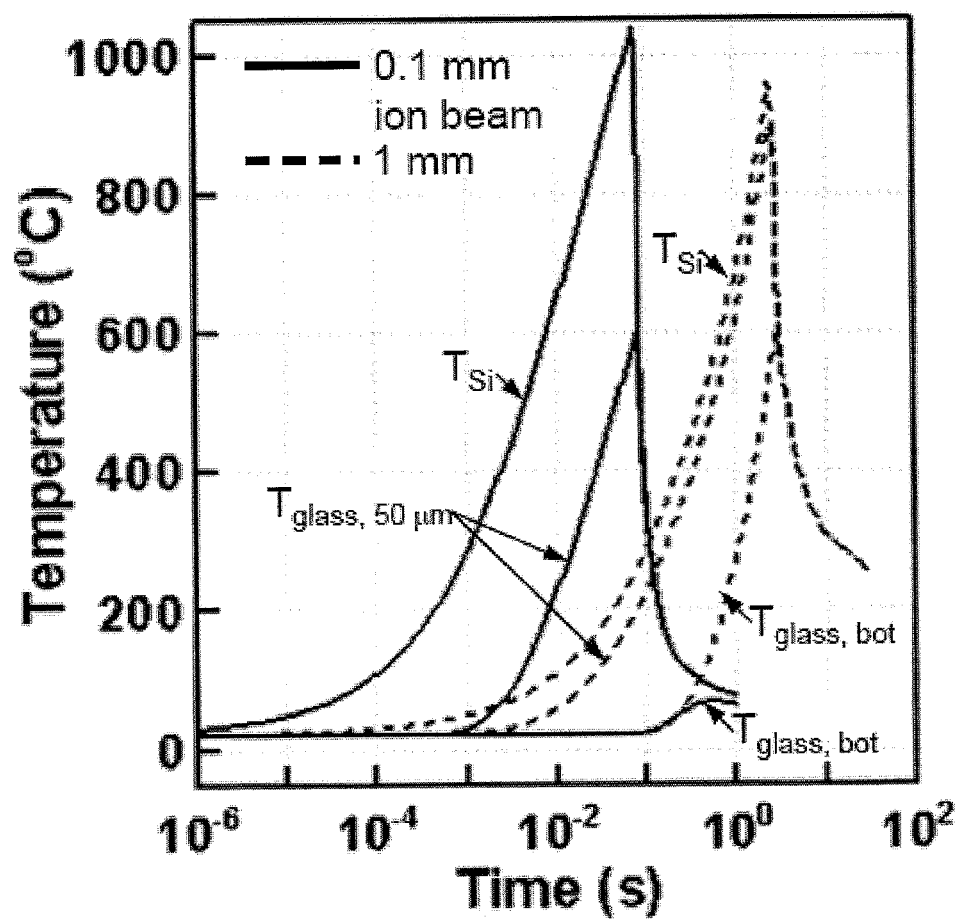
FIG. 7 shows a graph of the temperature of a substrate irradiated with a focused particle beams according to another embodiment of the present disclosure.

If the height of the ribbon beam were to increase to 1 mm, it may take approximately 2.4 seconds to sufficiently heat the Si film, in which time the peak temperature of the bottom of glass may reach 600° C. This example, compared to the 0.1 mm case in FIG. 7, demonstrates the need to keep the power density of the beam as high as possible. This may be achieved by maintaining the beam area as small as possible, increasing beam current, and/or increasing the beam energy. The mass of the ion species may also be increased. The use of a molecular particle beam may be desirable as it allows the use of higher beam energies. At the same time, the higher beam energy may reduce additional detrimental effects such as space charge blow-up that may otherwise limit the beam currents and the beam focusing.

The particle beam irradiation may retain the solid Si in the amorphous phase, allowing melting to occur at 1300K. Crystalline Si does not melt until 1683K. Therefore if the amorphous Si undergoes crystallization before melting commences, more power may be required to completely melt the material. Also, liquid Si may reflect a portion of the laser radiation and so coupling power into the bulk of the Si may be difficult once the Si surface has melted. The presence of a particle beam during the cooling and crystallization phase may influence the production of high quality material.

Thin Film Solar Cell

The particle induced phase transformation described in the present disclosure may also be applied to manufacture of thin film solar cells. As known in the art, amorphous Si is a direct band gap material and may absorb light more efficiently than crystalline Si, an indirect band gap material. In addition, amorphous Si absorbs more light in the visible spectrum than crystalline Si. However, amorphous Si has lower electrical conductivity. As such, amorphous Si may preferably transform incident radiation to electrical current, whereas crystalline Si may preferably transfer the generated electrical current. Accordingly, the solar cell, according to the present embodiment, may preferably have a layer of amorphous Si above another layer of crystalline Si. Incident radiation at visible wavelengths may be efficiently converted into photocurrent in the amorphous Si. Light not converted in the amorphous layer (including infra-red radiation) may be converted into photocurrent in the crystalline Si.

Figure 8A:
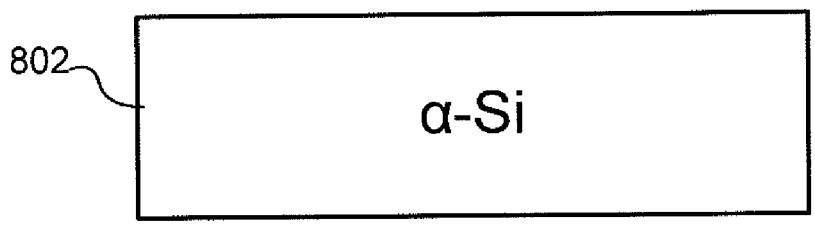
FIG. 8A-8B show a method that can be incorporated into manufacturing of a solar cell according to another embodiment of the present disclosure.
Figure 8B:
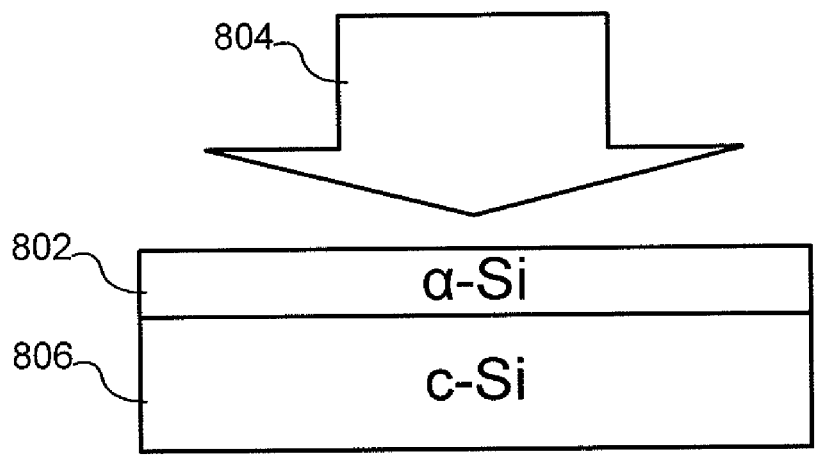

Referring to FIG. 8, there is shown a process that may be incorporated in preparing a substrate according to another embodiment of the present disclosure. In the present embodiment, the substrate may be a thin film solar cell with crystalline and amorphous layers. In another embodiment, the substrate may be a semiconducting layer of a FPD that is disposed on an insulating layer (not shown). As illustrated in FIG. 8A, an amorphous Si layer 802 may be deposited onto a glass layer (not shown). The Si layer 802 may have thickness of 1.5 μm, whereas the glass layer may have thickness of 3 mm. The particles 804 having a predetermined dose and energy may then be introduced to the amorphous Si layer 802. As illustrated in FIG. 8B, the particles 804 may be introduced below the surface of Si layer to crystallize a lower portion of Si layer 802, without inducing crystallization of the upper portion of amorphous Si layer 802. The resulting substrate may be used in a solar cell having an amorphous Si layer 802 disposed on the crystal Si layer 806.

Figure 9C:
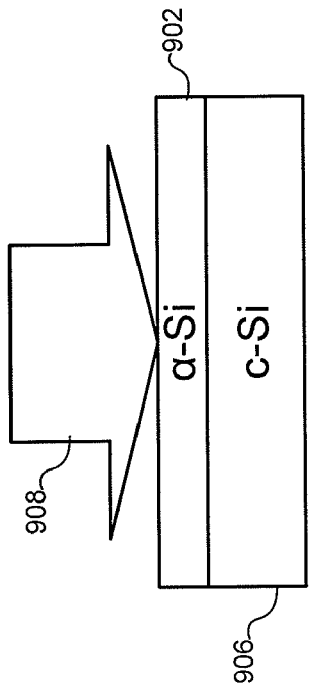
FIG. 9A-9C show another method that can be incorporated into manufacturing of a solar cell according to another embodiment of the present disclosure.
Figure 9A:
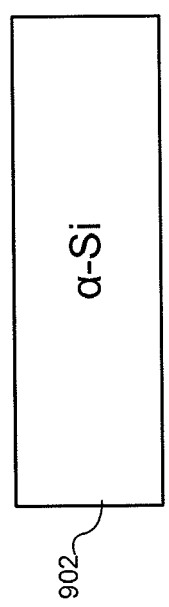
Figure 9B:
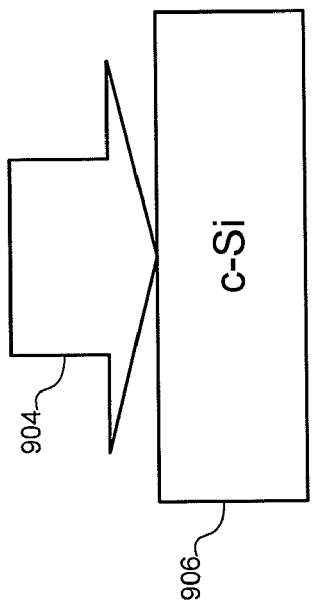
Figure 10A:
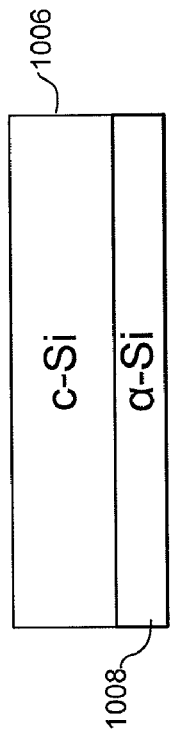
FIG. 10A-10D show another method that can be incorporated into manufacturing of a solar cell according to another embodiment of the present disclosure.
Figure 10B:
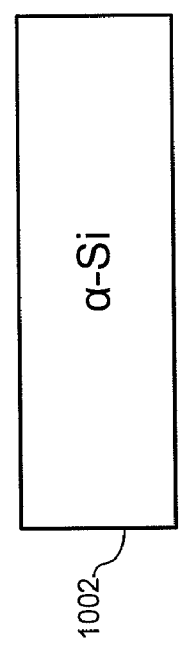
Figure 10C:
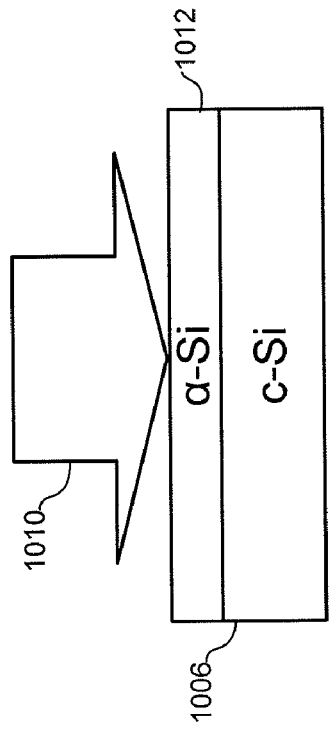
Figure 10D:
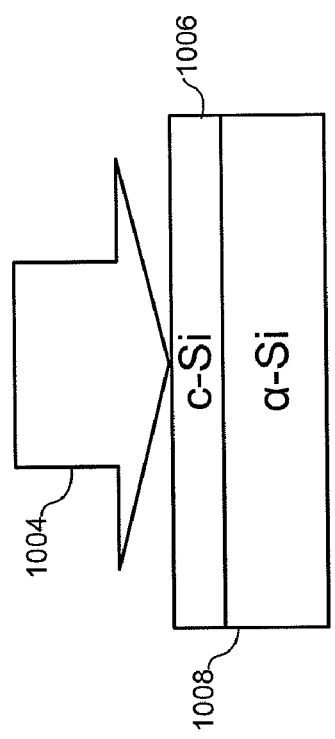

Referring to FIG. 9, there is shown a process that may be incorporated in preparing a substrate according to another embodiment of the present disclosure. In the present embodiment, the substrate may be a thin film solar cell with crystalline and amorphous layers. In another embodiment, the substrate may be a semiconducting layer of a FPD that is disposed on an insulating layer (not shown). As illustrated in FIG. 9A, an amorphous Si layer 902 may be deposited onto a glass layer (not shown). Thereafter, particles 904 having a predetermined dose and energy may be introduced to the amorphous Si layer 902 to crystallize the entire Si layer 906 (FIG. 9B). As illustrated in FIG. 9C, a plurality of particles of second species 908, energy, and dose may be introduced to the substrate to amorphize a layer near the surface of the crystalline Si layer. The resulting solar cell may have an amorphous top Si layer 904 and a crystalline lower Si layer 902.

Referring to FIG. 10, there is shown a process that may be incorporated in preparing a substrate according to another embodiment of the present disclosure. In the present embodiment, the substrate may be a thin film solar cell with crystalline and amorphous layers. In another embodiment, the substrate may be a semiconducting layer of a FPD that is disposed on an insulating layer (not shown). As illustrated in FIG. 10A, an amorphous Si layer 1002 may be deposited onto a glass layer (not shown). Thereafter, particles 1004 having a predetermined dose and energy may be introduced to the amorphous Si layer 1002 to crystallize a sub-layer 1006 within the Si layer 1002 (FIG. 10B). Although FIG. 10B illustrate a sub-layer disposed near the upper surface of the Si layer 1002, those of ordinary skill in the art should recognize that the sub-layer 1006 may be positioned near the upper surface, near the lower surface, or anywhere between the upper surface and the lower surface of Si layer 1002.

After forming the crystalline sub-layer 1006, one or more of the crystals in the sub-layer 1006 may be grown away from the sub-layer 1006 until the entire Si layer 1002 may be crystallized. The crystals may be grown via one of furnace annealing, rapid thermal annealing (RTA), flashlamp annealing, and laser annealing. Alternatively, the crystals may be grown by particle assisted annealing. For example, the same or another types of particles (not shown) having another predetermined dose and/or another predetermined energy to the region below the crystallized sub-layer to extend the grain boundary of one or more crystals toward the lower surface of the substrate. In the process, the entire Si layer 1002 may contain one or more crystals having grain boundaries that extend in a vertical direction. The present embodiment may also include an optional amorphizing step to amorphize a portion of the newly crystallized Si layer 1006. For example, the particles 1010 may then be introduced to the newly crystallized Si layer 1002 to amorphize at least a portion of the newly crystallized Si layer 1002 (FIG. 10D) to form an amorphous sub-layer 1012. In the present disclosure, the particles introduced to the newly crystallize Si layer 1002 the same particles as those used to crystallize the previous amorphous Si layer 1002. Alternatively, the particles introduced to the newly crystallize Si layer 1002 may be different from those used to crystallize the previous amorphous Si layer 1002. The above process may be used to crystallize a thick amorphous Si layer.

The particle induced phase transformation may also be used to manufacture an efficient polycrystalline Si solar cell. The grain boundaries of crystals may be efficient sites for gettering impurities, such as metal contaminants. In addition, grain boundary may serve as a barrier for charge carriers' mobility, inhibiting the carriers from traveling through the boundary. Accordingly, polycrystalline solar cells having multiple crystals, thus multiple grain boundaries, may have relatively low electrical conductivity if the grain boundaries are located across the path of the charge carriers. In the polycrystalline solar cells, electrical current generated at the upper surface must be transported to contact areas, which are generally located at the lower surface of the solar cell. If the grain boundaries in the polycrystalline solar cells are positioned across the path of the charge carriers, the efficiency of the solar cells may be lowered. As such, it may be desirable to manufacture polycrystalline solar cells having grain boundaries oriented in parallel manner relative to the path of the charge carriers.

To manufacture an efficient polycrystalline solar cell, an amorphous Si substrate may be prepared. Thereafter, the upper surface of the Si layer may be crystallized, and the crystals may grow downward per solid phase epitaxial regrowth (SPER). The ion energy may be chosen so that the power density delivered to the substrate may be maximized. This may correspond to an energy of between 40 to 100 kev, where typical ion beam systems can extract the maximum beam currents from an ion source and where space charge effects are reduced for beam transport and focusing. Such an ion beam may cause crystallization near the surface of the silicon which in turn may seed SPER downwards until the whole layer is crystallized. The SPER may take place as part of the beam induced crystallization step, or in a further annealing step that may use one or more of furnace, RTA, flashlamp, laser or other annealing methods. The resulting substrate will likely to have crystals with vertically extending grain boundaries. Thereafter, particles of second species, energy, and dose may be introduced to the substrate to amorphize a layer near the surface of the polycrystalline substrate. The solar cell may then have a structure of amorphous Si layer above vertically extending polycrystalline Si layer. As noted above, such a solar cell will likely to convert radiation energy to electrical energy more efficiently, and, at the same time, transport the converted electrical energy more efficiently.

In the present disclosure, the size and orientation of the boundaries may be influenced by the choice of the particle beam conditions used to assist the crystallization of the top layer. Phosphorous may be a favorable species as it is a good getter species, and may be the dopant of choice for the solar cell. The direction of implant may be chosen to influence the grain orientation. The whole active layer may be implanted, or the surface layer may be implanted to create a top crystalline surface with few voids, and the rest of the substrate may be regrown by SPER.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the foregoing description is by way of example only and is not intended as limiting. What is claimed is any feature detailed herein.

What is claimed is:

1. A method for preparing a substrate in an amorphous phase, comprising:
    introducing a plurality of first particles to a first region of the substrate;
    forming at least one crystal having a grain boundary in the first region without forming another crystal in a second region, the second region adjacent to the first region; and
    extending the grain boundary of the at least one crystal formed in the first region to the second region after stopping the introducing the plurality of first particles.

2. The method of claim 1, wherein the first region is a portion of the substrate.

3. The method of claim 1, wherein the first region is proximate to an upper side of the substrate and wherein the extending the grain boundary to the second region comprises extending the boundary toward a lower side of the substrate.

4. The method of claim 1, wherein the first region is proximate to a lower side of the substrate and the extending the grain boundary to the second region comprises extending the boundary toward an upper side of the substrate.

5. The method of claim 1, wherein the region is spaced apart from the upper and lower surfaces and the extending the grain boundary to the second region comprises extending the boundary toward an upper side and a lower side of the substrate.

6. The method of claim 1, wherein the at least one crystal in the first region is formed via a solid phase nucleation.

7. The method of claim 1, wherein the extending the grain boundary to the second region is achieved via a solid phase epitaxial regrowth.

8. The method of claim 1, further comprising:
    introducing a plurality of second particles to at least a portion of the first region to amorphize the at least a portion of the first region.

9. The method of claim 8, wherein the amorphized portion is adjacent to an upper surface of the substrate, wherein the substrate comprises a plurality of crystals, and wherein the plurality of crystals have grain boundaries extending along a vertical direction.

10. The method of claim 1, wherein the extending the grain boundary is performed by one of furnace annealing, rapid thermal annealing (RTA), flashlamp annealing, and laser annealing.

11. The method of claim 1, wherein the extending the grain boundary to the second region is performed by a particle assisted growth.

12. The method of claim 11, wherein the particle assisted annealing comprises introducing a plurality of third particles to the second region.

13. The method of claim 12, wherein the particle assisted annealing further comprises adjusting energy of the third particles.

14. The method of claim 13, wherein the adjusting the energy of the third particles comprises increasing the energy of the third particles.

15. The method of claim 1, wherein the substrate is a Si layer of a FPD workpiece, the FPD workpiece comprising the Si layer disposed on an insulating layer.

16. The method of claim 1, wherein the substrate is a solar cell panel.

17. The method of claim 1, wherein the first particles is introduced to the first region at a density rate of $5 \times 10^{14}$ particles/cm$^2$ sec or greater.

18. The method of claim 1, wherein the first particles are introduced to the first region as a focused particle beam.

19. The method of claim 18, wherein the focused particle beam has decreasing cross sectional density profile from a first cross sectional end to a second cross sectional end.

20. The method of claim 1, wherein the first particles comprise molecular ions.

21. The method of claim 1, wherein the first particles comprise cluster particles.

22. The method of claim 1, wherein the first particles comprise protons or deuterons.

23. The method of claim 1, wherein the first particles comprise one or more species chosen from a group consisting of: He, Ne, Ar, Xe, and Rn.

24. The method of claim 1, wherein the first particles is Ga.

25. The method of claim 1, wherein the first region comprises Si and wherein the first particles comprise one or more species chosen from a group consisting of and Ge so as to convert the first region to a stressed region.

26. The method of claim 1, wherein the first region comprises a material selected from Group IV elements and wherein the first particles comprise one or more species chosen from a group consisting of B, Ga, In, P, As, Sb, and Bi, so as to change arm electrical property of the first region.

27. The method of claim 1, wherein the first region comprises a material selected from Group IV elements and wherein the first particles comprise one or more species chosen from a group consisting of Yb, Ti, Zr, Pd, Pt, and Al, so as to change a bandgap property of the first region.

28. The method of claim 1, wherein the first region comprises a material selected from Group IV elements and wherein the first particles comprise one or more species chosen from a group consisting of C containing particles, Si containing particles, Ge containing particles, F containing particles, N containing particles, H containing particles, He containing particles, Sn containing particles, and Pb containing particles, so as to prevent changing of an electrical property of the first region.

29. The method of claim 1, wherein the first region comprises a material selected from Group IV elements and wherein the first particles comprise metallic particles so as to increase a rate of forming the at least one crystals in the first region.

30. The method of claim 29, the metallic particles comprise Ni particles.

31. The method of claim 1, further comprising:
changing temperature of the substrate prior to introducing the first particles to the first region.

32. The method of claim 31, wherein the changing the temperature comprises decreasing the temperature.

33. The method of claim 1, wherein the first particles are introduced to the first region at an angle perpendicular to an upper surface of the substrate.

34. The method of claim 1, wherein the first particles are introduced to the first region at an angle other than an angle perpendicular to an upper surface of the substrate.

* * * * *